(12) United States Patent
Inoue et al.

(10) Patent No.: US 10,134,944 B2
(45) Date of Patent: Nov. 20, 2018

(54) LIGHT-EMITTING ELEMENT AND METHOD FOR PRODUCING THE SAME

(71) Applicant: NICHIA CORPORATION, Anan-shi, Tokushima (JP)

(72) Inventors: Hiroyuki Inoue, Itano-gun (JP); Tomohiro Shimooka, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/957,692

(22) Filed: Apr. 19, 2018

(65) Prior Publication Data

US 2018/0240934 A1    Aug. 23, 2018

Related U.S. Application Data

(63) Continuation of application No. 15/361,222, filed on Nov. 25, 2016, now Pat. No. 9,978,903.

(30) Foreign Application Priority Data

Nov. 26, 2015   (JP) .................................. 2015-231118

(51) Int. Cl.
   *H01L 33/00*   (2010.01)
   *H01L 33/20*   (2010.01)
   *H01L 33/32*   (2010.01)
   *H01L 33/12*   (2010.01)

(52) U.S. Cl.
   CPC ............ *H01L 33/007* (2013.01); *H01L 33/20* (2013.01); *H01L 33/32* (2013.01); *H01L 33/12* (2013.01)

(58) Field of Classification Search
   CPC ........ H01L 33/007; H01L 33/20; H01L 33/32
   See application file for complete search history.

(56) References Cited

U.S. PATENT DOCUMENTS

| 6,015,979 A | 1/2000 | Sugiura et al. |
| 9,159,875 B2 | 10/2015 | Cheon et al. |
| 2003/0168666 A1 | 9/2003 | Okuyama et al. |
| 2005/0179130 A1 | 8/2005 | Tanaka et al. |
| 2008/0121903 A1 | 5/2008 | Hiramatsu et al. |

(Continued)

FOREIGN PATENT DOCUMENTS

| EP | 3 007 237 A1 | 4/2016 |
| JP | 2005-064492 A | 3/2005 |
| JP | 2010-171382 A | 8/2010 |

(Continued)

OTHER PUBLICATIONS

Notice of Allowance for U.S. Appl. No. 15/361,222 dated Jan. 24, 2018.

*Primary Examiner* — Errol Fernandes
(74) *Attorney, Agent, or Firm* — Foley & Lardner LLP

(57) ABSTRACT

A light-emitting element includes: a sapphire substrate including: a principal surface that is in a c-plane of the sapphire substrate, and a plurality of projections on the principal surface, wherein each of the plurality of projections has a shape of pseudo-hexagonal pyramid including six lateral surfaces, each of the six lateral surfaces including an inwardly curved surface portion, and wherein, in a top view of the sapphire substrate, each of the plurality of projections has a shape of a pseudo-hexagon; and a semiconductor layered body comprising a nitride semiconductor on the principal surface side of the sapphire substrate, the semiconductor layered body including an active layer.

19 Claims, 12 Drawing Sheets

(56) References Cited

U.S. PATENT DOCUMENTS

2008/0303042 A1 12/2008 Minato et al.
2012/0168753 A1 7/2012 Sanga

FOREIGN PATENT DOCUMENTS

| | | |
|---|---|---|
| JP | 2011-009382 A | 1/2011 |
| WO | WO-02/103813 A1 | 12/2002 |
| WO | WO-2011/074534 A1 | 6/2011 |
| WO | WO-2013/150984 A1 | 10/2013 |
| WO | WO-2014/192821 A1 | 12/2014 |

LIGHT-EMITTING ELEMENT AND METHOD FOR PRODUCING THE SAME

CROSS-REFERENCE TO RELATED APPLICATIONS

The present application is a continuation of U.S. patent application Ser. No. 15/361,222, filed on Nov. 25, 2016, which claims priority to Japanese Patent Application No. 2015-231118, filed on Nov. 26, 2015, the disclosures of which are hereby incorporated by reference in their entireties.

BACKGROUND OF THE INVENTION

1. Field of the Invention

The present disclosure relates to a light-emitting element including a substrate having projections and to a method for producing the light-emitting element.

2. Description of Related Art

Generally, light-emitting elements (e.g., light-emitting diodes: LEDs) made of semiconductors such as nitride semiconductors each has a structure in which an n-type semiconductor layer, an active layer, and a p-type semiconductor layer are layered on a sapphire substrate in this order. Techniques of forming projections on sapphire substrates to improve light extraction efficiency of light-emitting elements have been proposed. (e.g., see WO 2011/074534).

SUMMARY

According to a producing method in WO 2011/074534, hexagonal-shaped resists are formed on a sapphire substrate using an exposure mask, and the sapphire substrate is etched using the resists, which forms hexagonal-pyramid shaped projections.

In the producing method in WO 2011/074534, etching is performed using resists each having a simple hexagonal shape. Since corner portions of a resist tend to be more quickly etched off, the hexagonal-shaped resists may be deformed into near-circular shapes as the etching progresses. Thus, the projections may each have a near-conical shape. Accordingly, with the technique disclosed in WO 2011/074534, the projections may each have a shape similar to a cone rather than hexagonal pyramids. Certain embodiments of the present invention have been made in view of such a problem. One object of certain embodiments of the present invention is to provide a light-emitting element with improved light extraction efficiency, and a method for producing the light-emitting element.

A light-emitting element according to an embodiment of the present invention includes a sapphire substrate and a semiconductor layered body. The sapphire substrate has a principal surface that is a c-plane of the sapphire substrate. The semiconductor layered body is made of nitride semiconductors and disposed on a principal surface side of the sapphire substrate. The semiconductor layered body includes an active layer. The sapphire substrate has a plurality of projections on the principal surface. Each of the plurality of projections has a shape of a pseudo-hexagonal pyramid. The pseudo-hexagonal pyramid includes six lateral surfaces. Each of the six lateral surfaces includes an inwardly curved surface portion. Each of the projections has a shape of a pseudo-hexagon in a top view. The pseudo-hexagon includes first curved lines curved toward the center of a hexagon and second curved lines passing through the vertices of the hexagon. The first curved lines are disposed between six vertices of the hexagon. The second curved lines and the first curved lines are connected to each other.

A method for producing a light-emitting element according to an embodiment of the present invention includes disposing a plurality of resists on a principal surface of a sapphire substrate, forming a plurality of projections on the principal surface by dry-etching the sapphire substrate, growing semiconductor layers made of nitride semiconductors on a principal surface side of the sapphire substrate to grow a semiconductor layered body including a light-emitting layer. The principal surface is a c-plane of the sapphire substrate. The dry-etching of the sapphire substrate removes the resists. In the disposing of the resists, each of the resists is formed to have a pseudo-hexagonal shape in a top view. The pseudo-hexagon includes first curved lines obtained by curving six sides of a hexagon toward the center of the hexagon and second curved lines passing through vertices of the hexagon. The second curved lines are connected to the first curved lines.

In the light-emitting element according to an embodiment of the present invention, crystal growth on the lateral surfaces of the projections can be reduced, which allows for forming semiconductor layers containing less gaps or voids, so that light extraction efficiency can be improved. In the method of producing a light-emitting element according to an embodiment of the present invention, the resists are formed to have shapes with consideration of ease of etching, the pseudo-hexagonal pyramid projections projecting from the sapphire substrate and having near-hexagonal bottom surfaces can be formed, and a light-emitting element having improved light extraction efficiency can be produced.

DETAILED DESCRIPTION OF EMBODIMENTS

Figure 1:
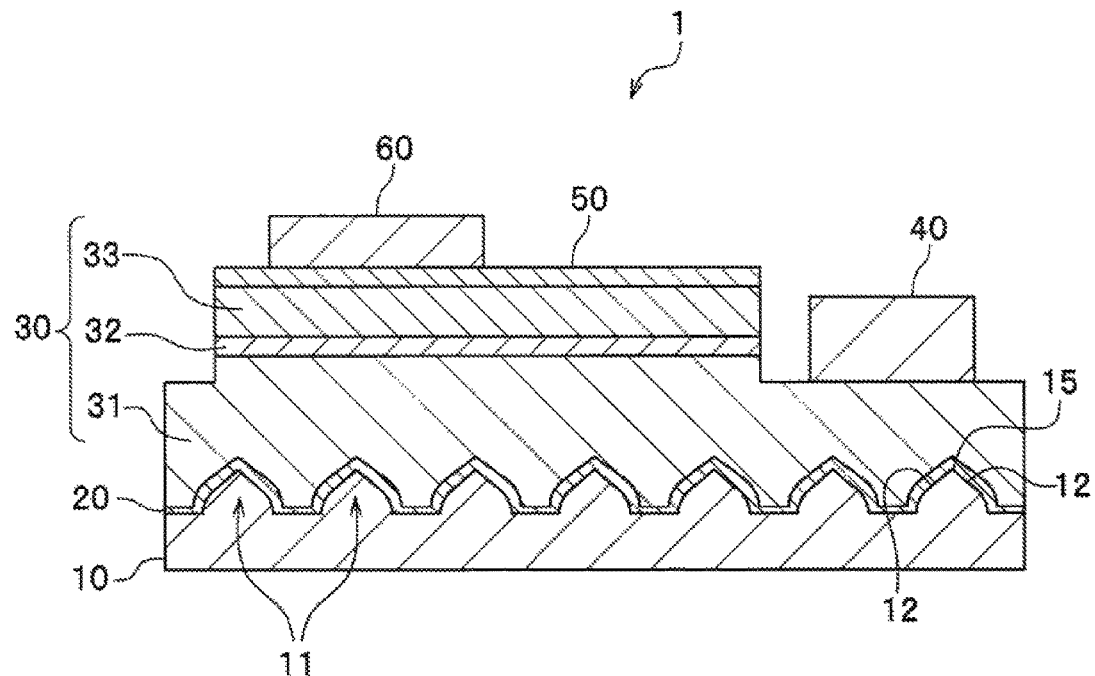
FIG. 1 is a schematic cross-sectional view of a light-emitting element according to a first embodiment.

A light-emitting element according to each embodiment will be described below referring to the drawings. The drawings referred in the descriptions below schematically illustrate each embodiment. The scales, the distances, the positional relations, or the like of members may be exaggerated, or illustration of part of the members may be omitted in some cases. Also, in the descriptions below, the same term or reference numeral generally represents the same member or members made of the same material, and its detailed description will be omitted as appropriate. Furthermore, directions in each drawing is not intended to represent absolute positions but represents relative positions of components.

First Embodiment

An example of a light-emitting element according to a first embodiment will be described referring to FIG. 1 to FIG. 6D.

As shown in FIG. 1, a light-emitting element 1 includes a sapphire substrate 10, a buffer layer 20, and a semiconductor layered body 30 made of nitride semiconductors. As an example, the light-emitting element 1 including an n-side electrode 40, a p-side electrode 50, and a light-transmissive electrode 60 is described below.

The sapphire substrate 10 is a member for supporting and growing the semiconductor layered body 30. The semiconductor layered body 30 is formed by layering semiconductor layers each made of a nitride semiconductor. The sapphire substrate 10 includes a plurality of projections 11 at a predetermined interval in a top surface of the sapphire substrate 10 on a c-plane side, which is a principal surface side of the sapphire substrate 10. Also, the sapphire substrate 10 has an overall thickness including the projections 11, for example, in the range of 300 µm to 1,000 µm.

Figure 2A:
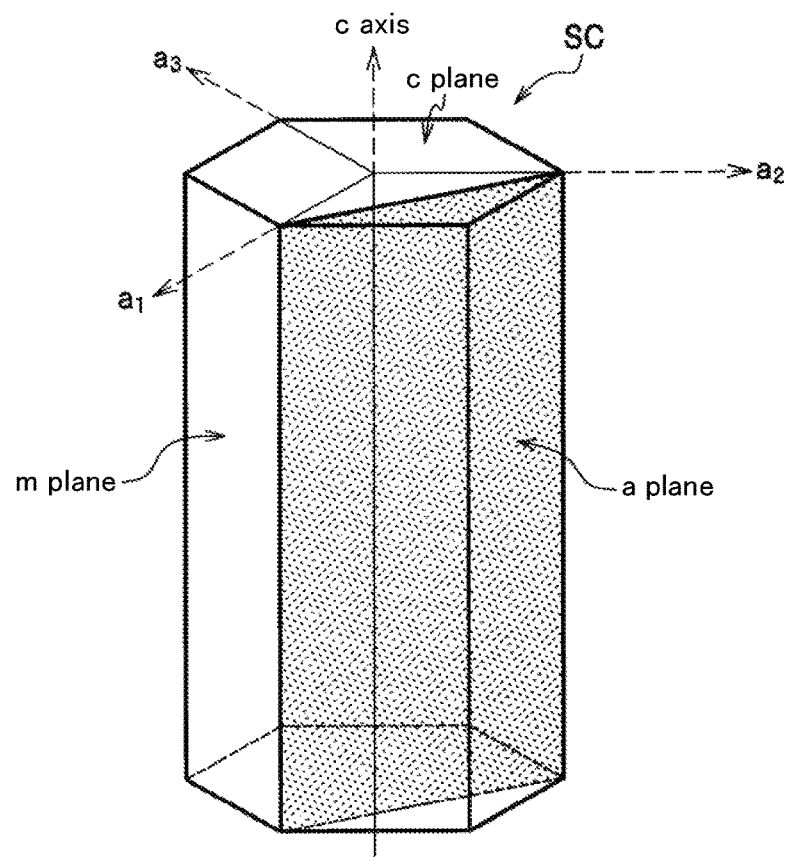
FIG. 2A is a schematic unit cell diagram illustrating plane orientations of a sapphire crystal in a sapphire substrate.
Figure 2B:
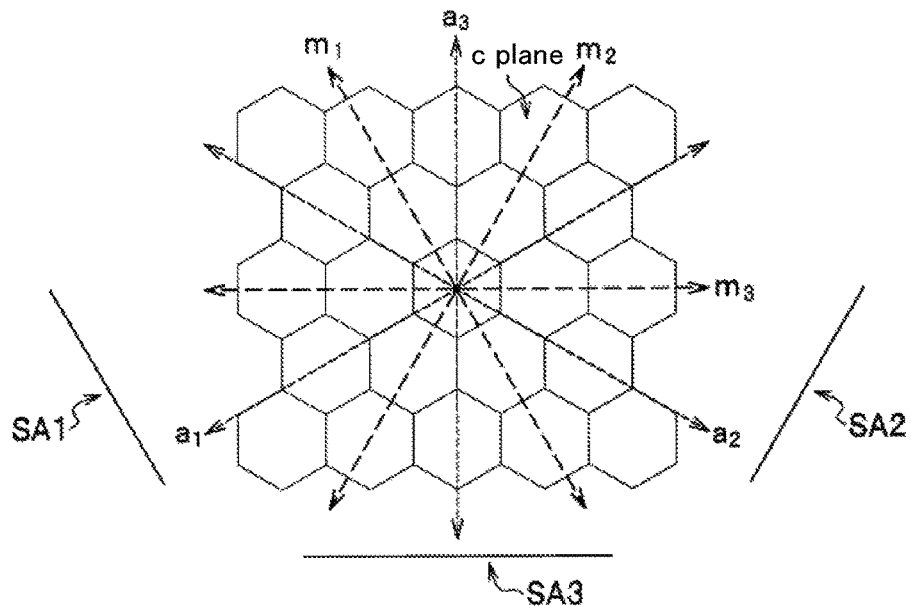
FIG. 2B is a schematic plan view of a sapphire crystal structure illustrating the plane orientations of the sapphire crystal in the sapphire substrate.

As shown in FIG. 2A and FIG. 2B, the sapphire substrate 10 is made of a sapphire crystal SC, which has a hexagonal crystal structure, and the principal surface of the sapphire substrate is the c-plane (i.e., (0001) plane). The c-plane in the present specification may have an off angle, that is, may be slightly inclined with respect to the c-plane. The degree of the off angle is, for example, about equal to or less than 3°. The sapphire crystal SC has, in addition to the c-plane, six m-planes and three a-planes. The m-planes are lateral surfaces of a hexagonal prism in a unit cell diagram, and are respectively perpendicular to the $m_1$-axis, the $m_2$-axis, and the $m_3$-axis. The a-planes include a first a-plane SA1, a second a-plane SA2, and a third a-plane SA3 that are perpendicular to the $a_1$-axis, the $a_2$-axis, and the $a_3$-axis, respectively.

Figure 3:
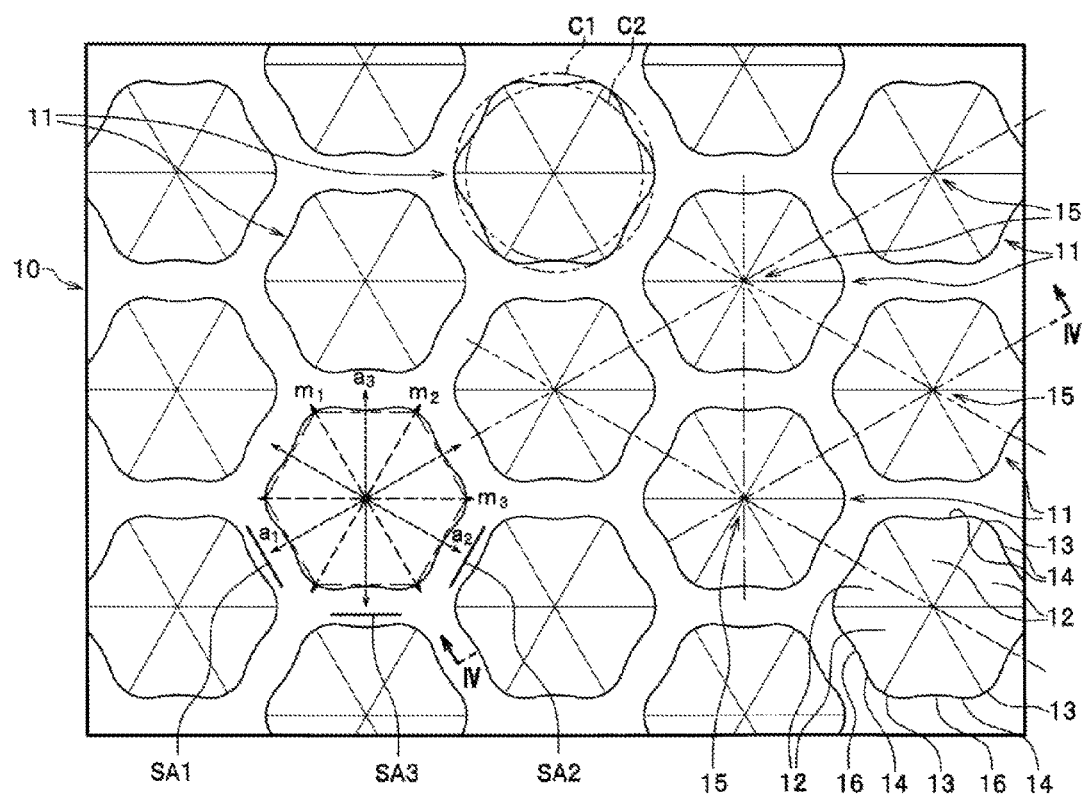
FIG. 3 is a schematic plan view of part of an alignment of projections on the sapphire substrate in the light-emitting element according to the first embodiment.

The projections 11 enable the semiconductor layered body 30 containing less crevices or voids to be formed in the case where a crystal of the semiconductor layers is grown on the sapphire substrate 10. As shown in FIG. 3 to FIG. 5B, each of the projections 11 has a pseudo-hexagonal pyramid shape having six lateral surfaces 12 each including an inwardly curved surface portion. The projection 11 has a pseudo-hexagonal top view shape (i.e., a shape of the bottom surface) formed by coupling first curved lines curved toward the center of an imaginary hexagon and disposed between six vertices 13 of the imaginary hexagon and second curved lines passing through the vertices 13 of the imaginary hexagon in a top view. Furthermore, in the pseudo-hexagon, curved line portions between the vertices 13 are referred to as sides 14, and the sides 14 are curved lines each inwardly curved at the midpoint 16 of the length of a side 14. In other words, the projection 11 has a pseudo-hexagonal pyramid shape having a bottom surface with a pseudo-hexagonal shape. The thick lines SA1 to SA3 in FIG. 3 are lines drawn to imaginarily represent the directions of the planes.

Thus, the shape of the projection 11 in a top view is made of a plurality of curved lines, so that surfaces of the projection 11 are made of curved surfaces having comparatively large curvatures. In the case where the projections each have a conventional cone shape, a lateral surface of each of the projections has relatively small curvature. Accordingly, in the lateral surface of each of such projections, areas of the r-planes and their approximate planes, on which crystals are easily grown, tend to be increased. In the case where the projections each have a pyramid shape, the projections are required to be disposed in specific orientations so that the lateral surfaces does not coincide with the r-planes or their approximate planes. This is similar in the case where the projections each has a shape such that corners of pyramids are rounded off. In each of the projections 11 according to the present embodiment, however, the lateral surfaces are made of the curved surfaces having relatively large curvatures, which can reduce areas of the r-planes and their approximate planes in the lateral surfaces in any orientation of arrangement of the projections. In other words, the lateral surfaces of each of the projections 11 according to the present embodiment are mainly made of planes other than r-planes and their approximate planes, on which crystals are easily grown from the lateral surfaces of the projection 11, of the sapphire substrate 10. That is, the lateral surfaces of each of the projections 11 according to the present embodiment are mainly made of crystal-growth-suppressed surfaces. With this structure, unintended crystal growth from the lateral surfaces 12 of each of the projections can be suppressed.

If unintended crystal growth of a semiconductor occurs on the projections on the sapphire substrate 10, growth of the semiconductor layer from a crystal growth plane located between the projections may easily be hindered, which may lead to difficulty in stable growth of the semiconductor layer. Accordingly, crystal defects such as dislocations may be generated in the semiconductor layered body 30 to be formed, or a gap or a void may be generated in the semiconductor layered body 30 and thus light extraction efficiency may be reduced. In the present embodiment, however, lateral surfaces of each of the projections 11 are made mainly of crystal-growth-suppressed planes to suppress unintended crystal growth, which allows the semiconductor layer to be stably grown from the crystal growth surface. With this structure, a semiconductor layer having a surface containing less dislocations can be formed. That is, in the present embodiment, with the lateral surfaces having the structure described above, a semiconductor crystal is not easily grown from the lateral surfaces 12 and can be stably grown from the crystal growth surface (the c-plane) between the projections 11, so that generation of a gap or a void around the projections 11 can be reduced. Thus, with the present embodiment, generation of a gap or a void in the semiconductor layered body 30 can be reduced, which can suppress occurrence of problems described above, so that a light-emitting element having good light extraction efficiency can be obtained.

In the present embodiment, the projections 11 are arranged so that the sides of the imaginary hexagon that is the original hexagon of the pseudo-hexagon is parallel to the a-planes (i.e., (11–20) planes) of the sapphire substrate 10. In this case, the r-planes (i.e., (–1012) planes) intersect with the sides of the imaginary hexagon at a 30-degree angle and are inclined with respect to the c-plane at about 58 degrees. That is, in the lateral surfaces of each of the protrusions, the r-planes and their approximate planes are located in the vicinity of ridge lines Rs of each of the projections 11. Meanwhile, the ridge lines Rs are formed by curved surfaces having relatively large curvatures and being coupled to the lateral surfaces 12. Accordingly, even if the lateral surfaces includes portions of the r-planes or their approximate planes, location of the regions of the r-planes and their approximate planes are limited to be in a portion of the ridge lines Rs. The other portion of the surfaces of each of the projections 11 are crystal-growth-suppressed surfaces, which can reduce unintended crystal growth from the lateral surfaces 12 of the projection, so that generation of a gap or a void can be suppressed, and thus a light-emitting element having good light extraction efficiency can be obtained.

The projections 11 are each formed as the pseudo-hexagonal pyramid so that each of the six continuous lateral surfaces 12 is a curved surface that is inwardly curved at the center of the lateral surface 12 and is located between the ridge lines Rs that are each located between adjacent lateral surfaces 12. Herein, each of the ridge lines Rs located between adjacent lateral surfaces 12 is a portion having maximum curvature in the curved surface continuously formed between the adjacent lateral surfaces 12. With the lateral surfaces 12 that are such curved surfaces, growth of a semiconductor layer from the lateral surfaces 12 can be delayed, and the semiconductor layer can be stably grown from the crystal growth surface (i.e., c-plane). In a top view, each of the lateral surfaces 12 has an approximate isosceles triangle shape made of a side 14 and ridge lines Rs adjacent to each other with a top portion 15 being one vertex. The base (i.e., side 14) of the lateral surface 12 is inwardly curved at its center toward the center of the top view of the each of the protrusions 11, which is defined by projecting the top portion 15 onto a bottom surface side. Furthermore, within the plane of the lateral surface 12, the curvature between adjacent ridge lines Rs is formed to be the maximum on the base (side 14) and become gradually smaller toward the top 15.

In each drawing, the ridge lines Rs are represented by thin lines between adjacent lateral surfaces 12 of the pseudo-hexagonal pyramid, which are schematic illustrations for easy understanding of these figures. Also, the six vertices 13 forming the bottom surface of each of the projections 11 are represented as points at which diagonals passing through the center of an imaginary regular hexagon and dividing the area of the imaginary regular hexagon into six equal parts are intersected with curved lines protruding outward among the curved lines forming the bottom surface of each of the projections 11.

In each of the projections 11, a circumscribed circle C1 of the pseudo-hexagon passing through the vertices 13 serves as the outermost diameter portion of the pseudo-hexagon being the bottom surface of each of the projections 11, and an inscribed circle C2 of the pseudo-hexagon passing through the midpoints 16 of the sides of the pseudo-hexagon serves as the innermost diameter portion of the pseudo-hexagon being the bottom surface of each of the projections 11. The ratio of the diameter r1 of the circumscribed circle C1 to the diameter r2 of the inscribed circle C2 is preferably in a range of 1.1 to 1.8. With the ratio of the diameter r1 of the circumscribed circle C1 to the diameter r2 of the inscribed circle C2 that is 1.1 or greater, the bottom surface of the projection 11 can be prevented from having a circular shape, so that distances between the projections 11 can be easily made even. Also, with the ratio of the diameter r1 of the circumscribed circle C1 and the diameter r2 of the inscribed circle C2 that is 1.8 or smaller, difference between a distance from the top portion 15 to the vertices 13 and a distance from the top portion 15 to the midpoints 16 of the curved sides 14 are prevented from being too large, and difficulty in forming of the semiconductor layered body 30 having a reduced dislocation density can be avoided. This is because increase of difference between the distance from the top portion 15 to the vertices 13 and the distance from the top portion 15 the midpoints 16 of the curved sides 14 causes decrease of the area of the projection 11 in the top view compared with the case where the positions of the vertices 13 are not changed and the difference between the distance from the top portion 15 to the midpoints 16 and the distance from the top portion 15 to the vertices 13 is reduced. With this structure, the area of the crystal growth surface, that is, a flat surface (c-plane) on which the projections 11 are not formed is relatively increased.

Accordingly, with this structure, an effect of reducing dislocations due to the projections 11 can be less easily obtained. The ratio described above is more preferably in the range of 1.1 to 1.3 and further preferably in the range of 1.1 to 1.25 in order to enhance light extraction efficiency. In other words, since the ratio of the diameter of the circumscribed circle C1 to the diameter of the inscribed circle C2 of a regular hexagon is about 1.15, the pseudo-hexagonal pyramid desirably has a pseudo-hexagonal base having a shape with a ratio close to this ratio of the regular hexagon. In the present embodiment, the pseudo-hexagon that is the shape of the bottom surface of the pseudo-hexagonal pyramid has rounded corners, so that the pseudo-hexagon may have a shape with a value smaller than the ratio of the regular hexagon, 1.15.

FIG. 6A to FIG. 6D show examples of the shape of the bottom surface of each of the projections 11 of the sapphire substrate 10. A projection 11 shown in FIG. 6A has a shape similar to the projection 11 shown in FIG. 5A, and is formed so that the ratio of the diameter of the circumscribed circle C1 to the diameter of the inscribed circle C2 is about 1.12. In a projection 11B shown in FIG. 6B, a ratio of the diameter of the circumscribed circle C1 to the diameter of the inscribed circle C2 thereof is about 1.23. Compared with the projection 11, this projection 11B has larger curvatures and larger degrees of curve of sides 14B, and the inclined angles of lateral surfaces 12B are steeper. In a projection 11C shown in FIG. 6C, a ratio of the diameter of the circumscribed circle C1 and the inscribed circle C2 is about 1.35. Compared with the projection 11B, this projection 11C has even larger curvatures and larger degrees of curve of sides 14C, and the inclined angles of lateral surfaces 12C are steeper. Accordingly, in the lateral surfaces 12C of the projection 11C, areas containing crystal growth surfaces (r-planes and their approximate planes) of the sapphire substrate 10 is reduced.

Figure 6A:
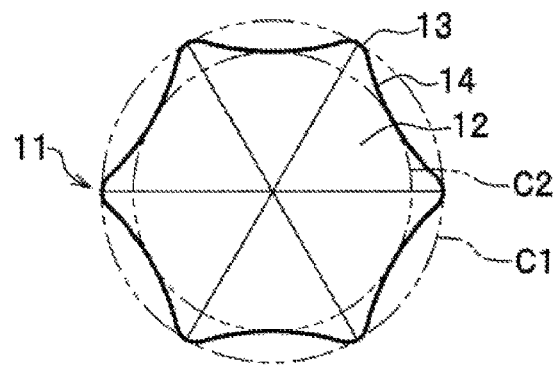
FIG. 6A is a schematic plan view for illustrating the case where a ratio of the diameter of the circumscribed circle to the diameter of the inscribed circle of the projection of the sapphire substrate in the light-emitting element according to the first embodiment is 1.125.
Figure 6B:
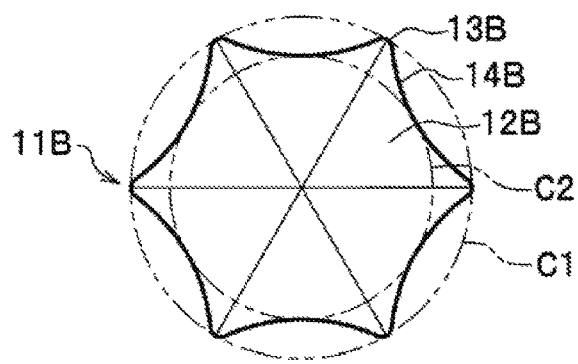
FIG. 6B is a schematic plan view illustrating the case where the ratio of the diameter of the circumscribed circle to the diameter of the inscribed circle of the projection of the sapphire substrate in the light-emitting element according to the first embodiment is 1.23.
Figure 6C:
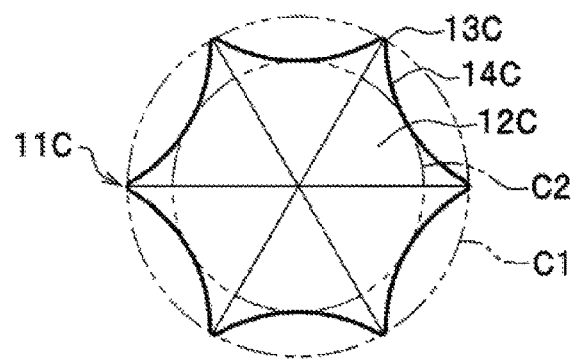
FIG. 6C is a schematic plan view for illustrating the case where the ratio of the diameter of the circumscribed circle to the diameter of the inscribed circle of the projection of the sapphire substrate in the light-emitting element according to the first embodiment is 1.35.
Figure 6D:
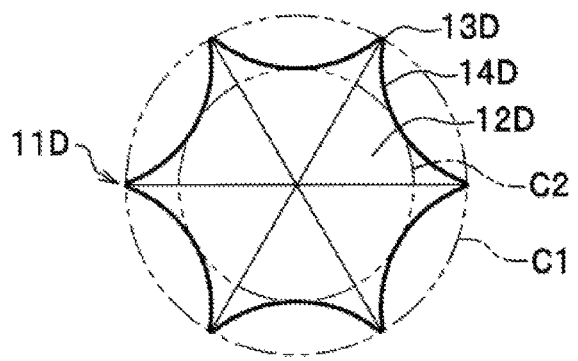
FIG. 6D is a schematic plan view for illustrating the case where the ratio of the diameter of the circumscribed circle to the diameter of the inscribed circle of the projection of the sapphire substrate in the light-emitting element according to the first embodiment is 1.5.

Furthermore, in a projection 11D shown in FIG. 6D, a ratio of the diameter of the circumscribed circle C1 to the diameter of the inscribed circle C2 is about 1.5. Compared with the projection 11C, this projection 11D has even larger curvatures and larger degrees of curve of sides 14D, and the inclined angles of lateral surfaces 12D are steeper. Accordingly, in the lateral surfaces 12D of the projection 11D, areas containing crystal growth surfaces (r-planes and their approximate planes) of the sapphire substrate 10 is reduced. The lateral surfaces of the projections 11B to 11D are made of curved surfaces similarly to the projection 11, on which semiconductor layers having a good crystallinity can be formed, so that light-emitting elements having good light extraction efficiency can be obtained. Herein, the r-planes of the sapphire substrate refers to the (−1012) plane, and the approximate planes of the r-planes refers to planes deviated from the r-planes by about 1 to 2 degrees or less. The surfaces of the projection 11 are preferably formed of planes other than such planes in view of reducing crystal growth.

Figure 4:
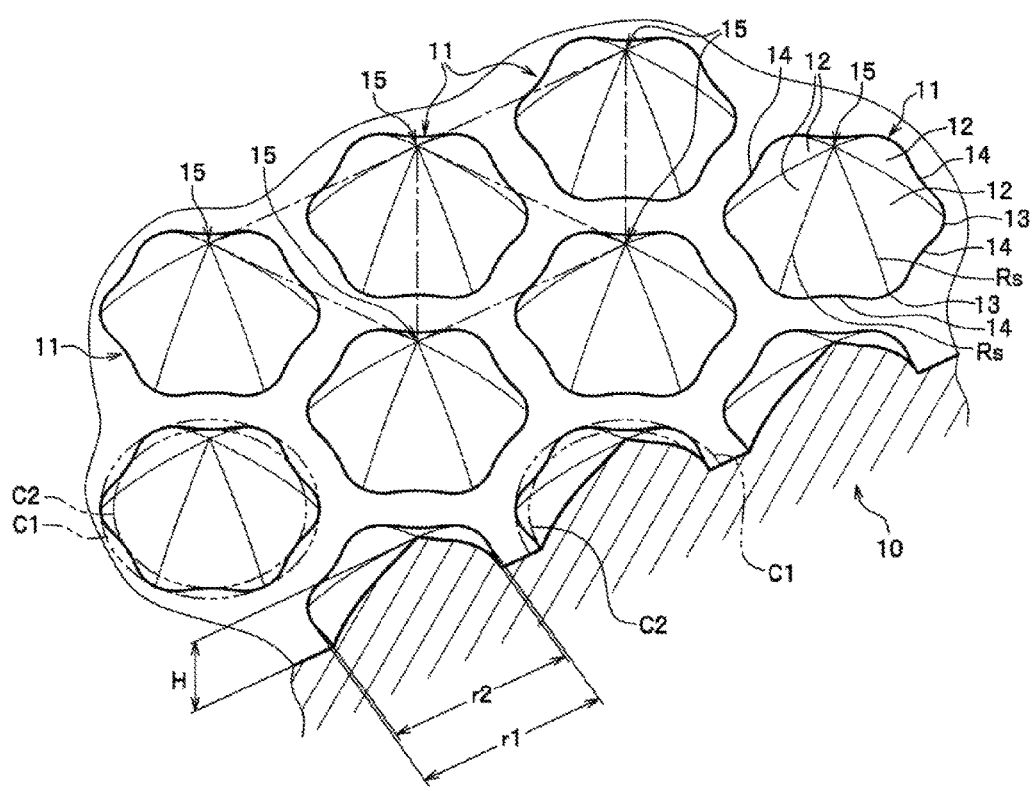
FIG. 4 is a schematic perspective view of the projections of the sapphire substrate in the light-emitting element according to the first embodiment cut along the line IV-IV in FIG. 3.
Figure 5A:
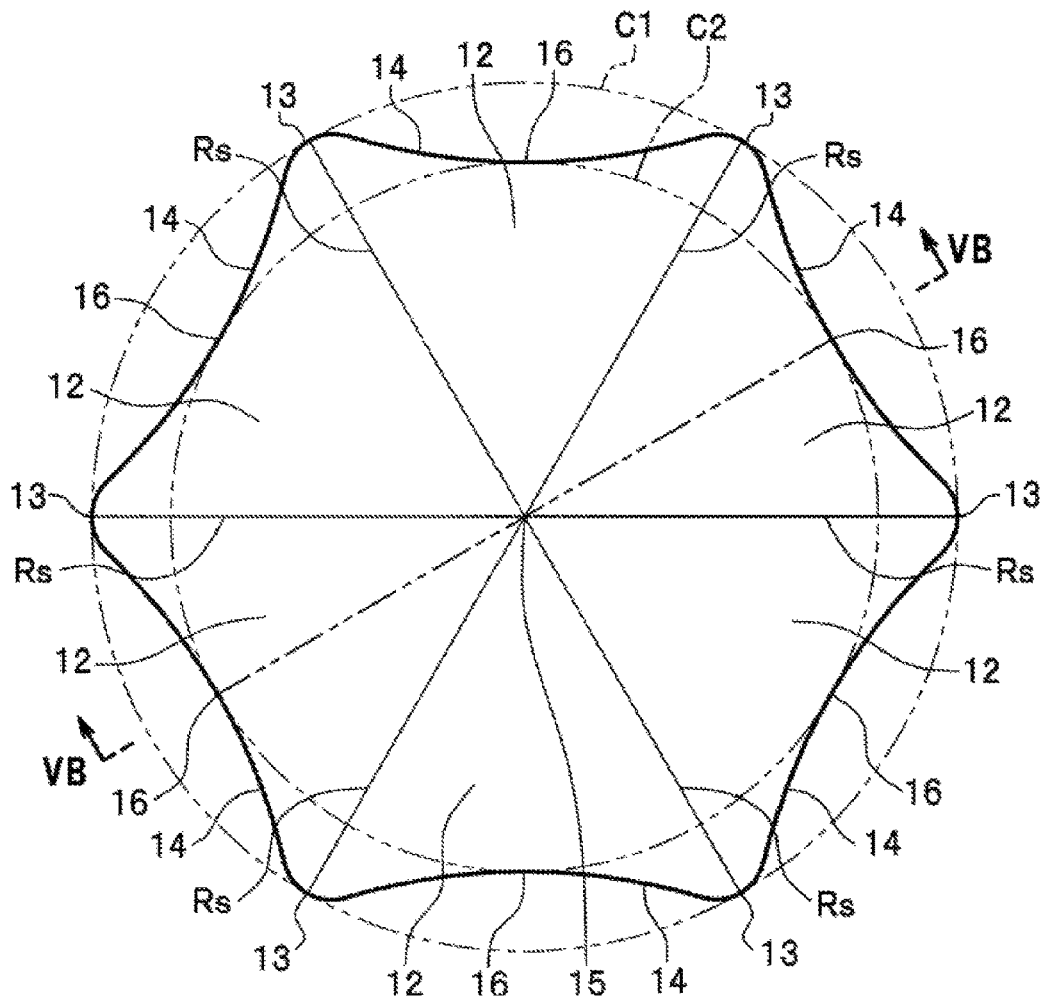
FIG. 5A is an enlarged schematic plan view of one of the projections of the sapphire substrate in the light-emitting element according to the first embodiment.
Figure 5B:
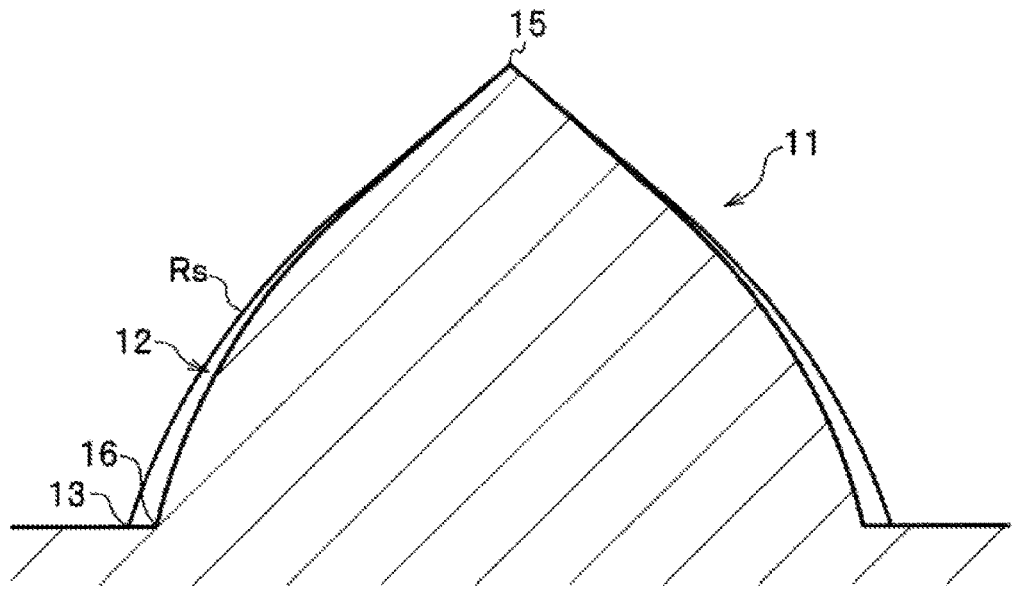
FIG. 5B is a schematic cross-sectional view of the projection of the sapphire substrate in the light-emitting element according to the first embodiment cut along the line VB-VB in FIG. 5A.

As shown in FIG. 3 and FIG. 4, the tops 15 of the projections 11 are preferably arranged in a triangular lattice pattern in a top view. In the case where the tops 15 (i.e., the centers of the projections 11 in a top view) are arranged in a triangular lattice pattern, the projections 11 are disposed so that a side of one of the projections 11 is parallel to one of the sides 14 of an adjacent projection 11. Also, in the case where the tops 15 of the projections 11 are arranged in a triangular lattice pattern in a top view, the projections 11 are further preferably arranged in an equilateral triangular lattice pattern. With this arrangement, distances between adjacent projections 11 can be even in a surface of the sapphire substrate 10. Accordingly, the growth rate of the semiconductor layer is substantially uniform within the crystal growth surface, so that a semiconductor layer having a good crystallinity can be easily formed, which can improve the light extraction efficiency of the light-emitting element 1.

Also, arrangement of the projections 11 in a triangular lattice pattern enables a plurality of projections 11 to be densely arranged. The distance (in the description below, referred to as a distance between the projections) between the tops 15 of adjacent projections 11 is preferably in the range of 2.2 to 3.1 µm, for example. With such distance between the projections, the crystallinity of the semiconductor layer to be grown on the sapphire substrate 10 can be improved, which can improve the light extraction efficiency of the light-emitting element 1 to be obtained.

Also, with the projections 11, the number of dislocations to be generated on the surface of the nitride semiconductor can be reduced. A mechanism of reducing the number of dislocations will be described below. In the sapphire substrate 10, each of the lateral surfaces 12 forming the projections 11 of the substrate is mainly made of a crystal-growth-suppressed plane, which suppresses growth of the nitride semiconductor thereon. On the other hand, a portion of a surface of the sapphire substrate 10 located between adjacent projections 11 is, for example, made of the c-plane, which is a crystal growth surface on which the nitride semiconductor can be grown. When the nitride semiconductor is grown in the vertical direction (i.e., thickness direction of the sapphire substrate 10) from the crystal growth surface, dislocations due to the difference between the lattice constant of the sapphire substrate 10 and the lattice constant of the nitride semiconductor tend to extend in the growing direction and to appear on a surface of the nitride semiconductor formed. When the nitride semiconductor is grown on the sapphire substrate 10, the nitride semiconductor is grown from the crystal growth surface located between the projections 11, while growth from the lateral surfaces 12 of the projections 11 is suppressed and the nitride semiconductor is not grown substantially. Accordingly, such structure can reduce dislocations appearing on the surface of the nitride semiconductor. For example, the dislocation density in a portion near a light-emitting layer can be about $5\times10^7$ dislocations/cm$^{-2}$ to $5\times10^8$ dislocations/cm$^{-2}$.

In the case where the semiconductor layered body 30 is formed by crystal growth of GaN, a crystal of GaN, which is in a hexagonal system, is grown with an upper direction being the c-axis direction. In lateral directions, the growth hardly progresses in the m-axis directions compared with in the a-axis directions. Thus, crystals tends to be grown with facet planes whose bases being planes equivalent to the m-planes (i.e., planes perpendicular to the c-plane of the sapphire substrate 10) of GaN in a plan view. In this case, the m-planes of GaN are located along the same planes as the a-planes of the sapphire substrate 10. In other words, GaN tends to be grown with facets whose bases being lines coinciding with the a-planes of the sapphire substrate 10 in a top view.

Accordingly, in a surface of the sapphire substrate 10, the projections 11 are preferably disposed so that the sides 14 of the pseudo-hexagonal pyramid will be parallel to planes different from the m-planes of the sapphire substrate 10, preferably parallel to the a-planes of the sapphire substrate 10. That is, as shown in FIG. 3, the projections 11 are preferably formed so that the sides 14 of the bottom faces will be parallel to the a-planes of the sapphire substrate 10. The expression "the sides 14 being parallel to the a-planes" refers to that, when adjacent vertices 13 are connected by straight lines, the straight lines are parallel to any one of the a-planes (i.e., any of the first a-plane SA1 to the third a-plane SA3).

With the projections 11 disposed so that the sides 14 of the pseudo-hexagon will be parallel to any one of the first a-plane SA1, the second a-plane SA2, and the third a-plane SA3, the bases of the facet planes of the semiconductor layered body 30 will be parallel to the outer peripheries of the sides 14 of the pseudo-hexagonal pyramid of each of the projections 11. With such structure of the projections 11, the nitride semiconductor is grown in the lateral directions to cover the projections 11 as the growth progresses, so that the dislocations extending in the growing direction are trapped within the nitride semiconductor. Accordingly, dislocations present on the surface of the nitride semiconductor can be reduced, and the semiconductor layered body 30 having a low dislocation density can be formed. That is, the nitride semiconductor of which crystals grown in the upper direction and the lateral directions gradually covers the projection 11 as the growth progresses. Finally, portions of the nitride semiconductor grown from the entire perimeter of each of the projections 11 are integrated on each of the projections 11. At this time, with the projection 11 having a structure described above, the nitride semiconductor tends to converge at one point (e.g., at a point near the center of the projection 11) on the projection 11. Accordingly, crystal defects extending in the growing direction tend to converge at one point or tend to be trapped within the nitride semiconductor, so that dislocations present on a surface of the nitride semiconductor layer can be reduced.

As shown in FIG. 1, the buffer layer 20 is provided in order to accommodate difference in lattice constants between the sapphire substrate 10 and the semiconductor layered body 30 to be grown on the sapphire substrate 10. The buffer layer 20 is formed between the sapphire substrate 10 and the semiconductor layered body 30. The buffer layer 20 is made of, for example, AlN or AlGaN. The buffer layer 20 can be formed by performing sputtering, for example, under predetermined conditions at a step of arranging the buffer layer as described below in the producing method. The buffer layer 20 has, for example, a layer shape covering the sapphire substrate 10 as shown in FIG. 1, while the sapphire substrate 10 may be partly exposed from the buffer layer 20. As described below, the buffer layer 20 is more preferably made of single-crystal AlN formed by sputtering. With such material, the number of dislocations appearing on the surface of the semiconductor layered body 30 can be further reduced. Thus, a light emitting element using such material for the buffer layer 20 can have the values of, for example, the output, Vf (i.e., forward voltage), and temperature properties that are better than the values of these of a light-emitting element using AlGaN for the buffer layer 20.

The semiconductor layered body 30 made of nitride semiconductors constitutes a light-emitting portion of the light-emitting element 1. Examples of the nitride semiconductor include $In_XAl_YGa_{1-X-Y}N$ ($0 \leq X$, $0 \leq Y$, and $X+Y \leq 1$). As shown in FIG. 1, the semiconductor layered body 30 is formed on a c-plane side (i.e., principal surface side) of the sapphire substrate 10 with the buffer layer 20 disposed therebetween, and includes an n-side semiconductor layer 31, an active layer 32, and a p-side semiconductor layer 33 that are layered in this order from the principal surface side of the sapphire substrate 10. The active layer 32 has a quantum well structure including, for example, a well layer (light-emitting layer) and a barrier layer. On the semiconductor layered body 30, for example, the n-side electrode 40 is formed on a portion of the n-side semiconductor layer 31 exposed by removing a portion each of the active layer 32 and the p-side semiconductor layer 33, and the p-side electrode 50 is formed on the p-side semiconductor layer 33. The p-side electrode 50 may be disposed on the light-transmissive electrode 60 formed on substantially the entire surface of the p-side semiconductor layer 33.

Method for Producing Light-Emitting Element

Next, a method of producing the light-emitting element according to the first embodiment will be described referring to FIG. 7 to FIG. 10C.

Figure 7:
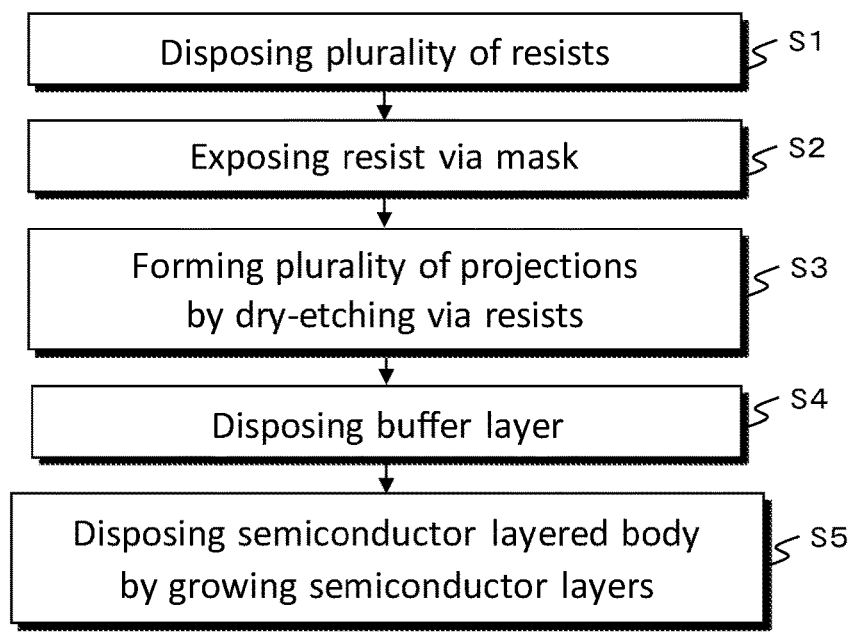
FIG. 7 is a flowchart illustrating an exemplary method of producing the light-emitting element according to the first embodiment.

In the method of producing the light emitting element according to the first embodiment, first, as shown in FIG. 7, a step S1 of disposing a resist film on the sapphire substrate 10 is performed. The resist film is formed on the entire surface of the sapphire substrate 10. The resist film is then exposed to light through a mask Ma (see FIG. 8), thereby performing an exposing step S2 of forming a resist pattern of resists Ra each having a predetermined shape. The number of the predetermined shapes correspond to the number of the projections 11 to be formed on the principal surface (c-plane) side of the sapphire substrate 10. After that, a step S3 of dry-etching the sapphire substrate 10 via the resists Ra (see FIG. 8) each having the predetermined shape formed in the light-exposing step S2 to form the projections 11 on the c-plane of the sapphire substrate 10 is performed.

Furthermore, a step S4 of disposing the buffer layer 20 on the sapphire substrate 10 with the projections 11 is performed. After that, a step S5 of growing a semiconductor layer on the buffer layer 20 to form the semiconductor layered body 30 is performed, so that the light-emitting element 1 is produced.

In the step S1 of disposing the resist film, the resist film is disposed on the sapphire substrate 10, for example, by application using a spin coater. In the case where the step S1 is performed on the sapphire substrate 10, before disposing the resist film, ashing is performed to slightly roughen the surface of the substrate by hitting a surface of the sapphire substrate 10 with plasma in order that the resist film to be formed will be less likely to be detached. Also, after the ashing, cleaning such as hydro cleaning is performed to remove dirt adhered to a surface of the substrate. The step S1 of disposing the resist film on the sapphire substrate 10 is then performed on the c-plane (0001) of the cleaned sapphire substrate 10. Examples of the resist film include positive resist films containing novolac resins as a main component. The ashing and the cleaning are not essential and may be omitted as appropriate in order to simplify the production procedure.

Figure 8:
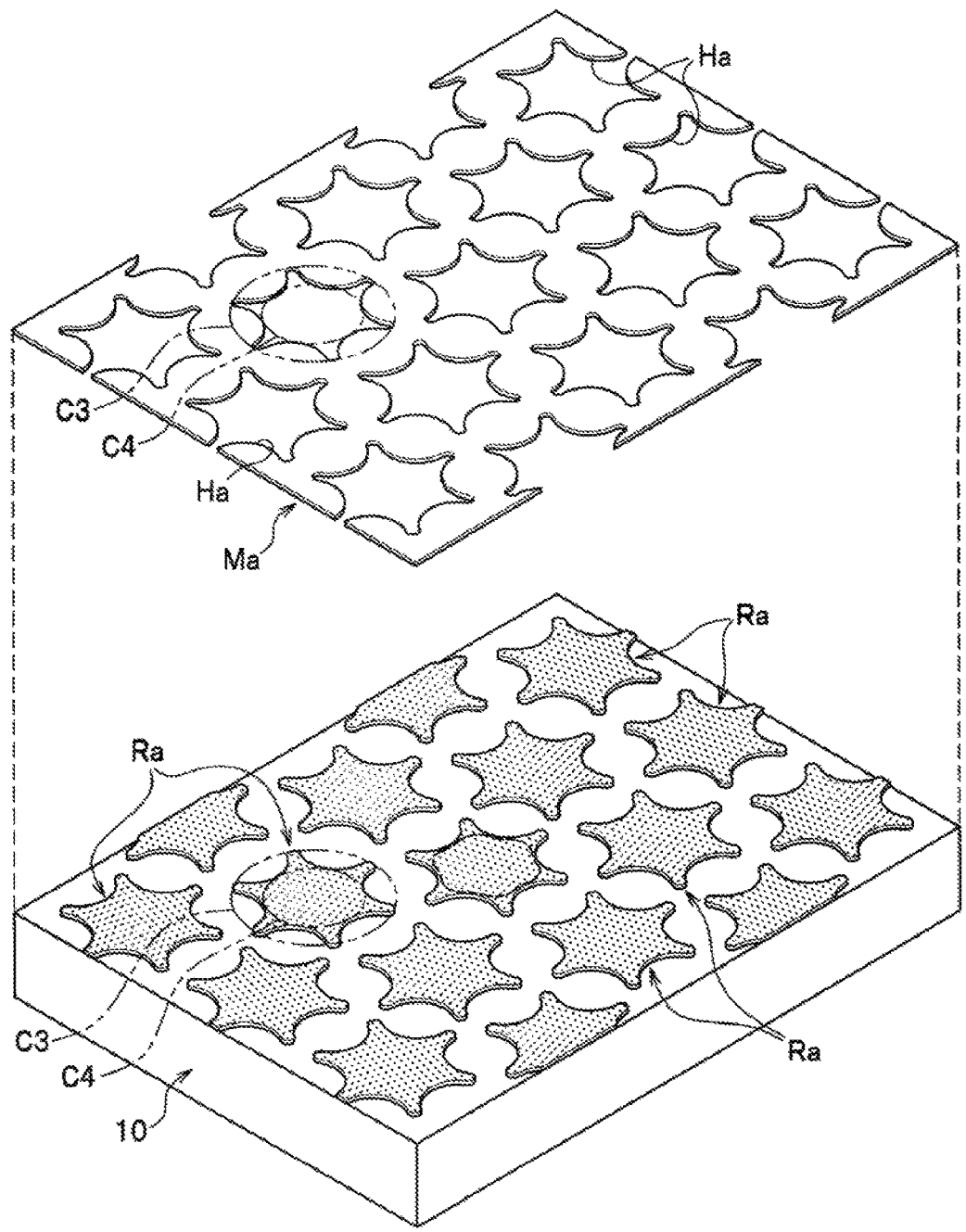
FIG. 8 is a schematic exploded perspective diagram illustrating the shapes of a mask and resists for forming the projections on the sapphire substrate in the light-emitting element according to the first embodiment.

After disposing the resist film on the sapphire substrate 10, as shown in FIG. 8, the exposing step S2 of exposing the resist film is performed by irradiation with light (i.e., irradiation with light including ultraviolet light) through the mask Ma having a predetermined shape. In the exposing step S2, the mask Ma having such a shape that can pattern the resist film into resists Ra that can form the projections 11 each having a desired pseudo-hexagonal pyramid shape after the etching of the sapphire substrate 10 is used.

Figure 9:
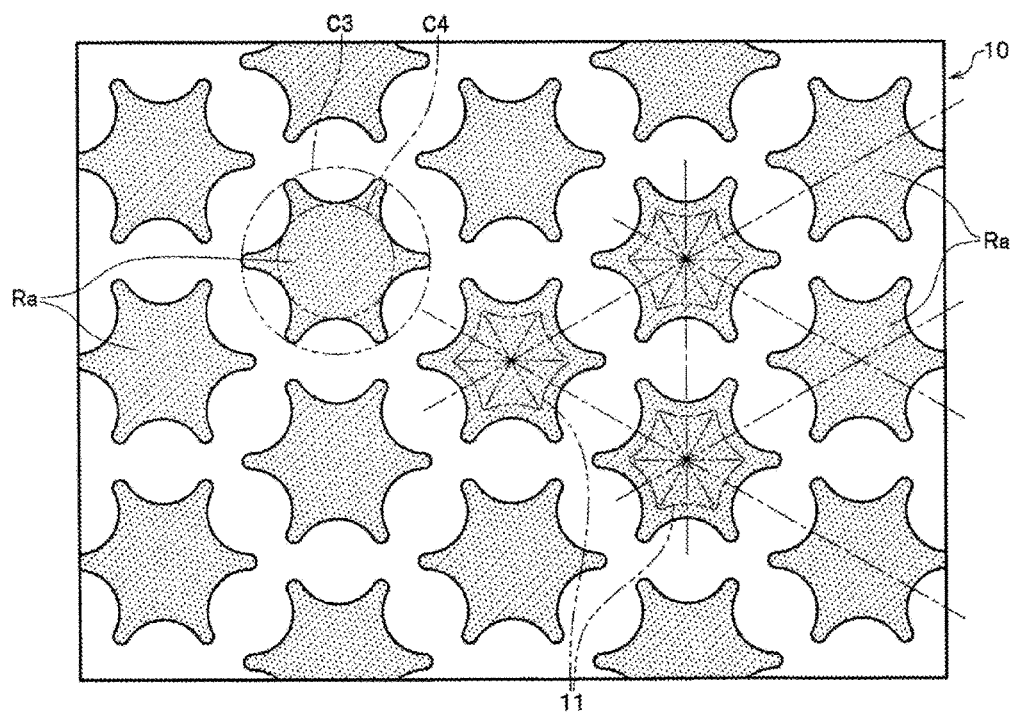
FIG. 9 is a schematic plan view of the resists for forming the projections on the sapphire substrate in the light-emitting element according to the first embodiment.

The mask Ma used in the light-exposing step S2 has a plurality through holes Ha each having, in a plan view, a pseudo-hexagonal shape formed by coupling first curved lines and second curved lines. The first curved lines are formed by curving six sides of a hexagon toward the center of the hexagon. The second curved lines pass through the vertices of the hexagon, as shown in FIG. 8. In more detail, the through hole Ha has a shape made of the first curved lines and the second curved lines, in which the first curved lines are formed by inwardly bending the sides of a regular hexagon between the vertices of a regular hexagon at the midpoints of the sides, which serve as apexes of the first curved lines, and the second curved lines are curved toward the vertices of the regular hexagon, which serve as the apexes of the second curved lines. The pseudo-hexagonal shapes of the through holes Ha in the mask Ma are used for patterning into the resists Ra on the sapphire substrate 10. Via the mask Ma, the exposing operation is performed using a stepper or other devices, so that the resists Ra serving as etching masks with pseudo-hexagonal resist patterns is formed, as shown in FIG. 9. At this time, the resists Ra have a top view shape that are approximately the same as the shapes of the through holes Ha formed in the mask Ma. After performing the exposing step S2, developing and UV curing are performed, which allow the resists to be formed into the pseudo-hexagons and baked, so that the resists Ra that can be used as the etching masks in the etching are formed (see FIG. 10A).

In the step S3 of dry-etching the sapphire substrate 10 via the resists Ra, the sapphire substrate 10 is dry-etched via the resists Ra formed in the light-exposing step S2 described above to form the projections 11 on the sapphire substrate 10 by the dry-etching. In the step S3 of dry-etching, the sapphire substrate 10 and the resists Ra are eroded to form the projections 11 having desired shapes.

The step S3 of dry-etching will be described referring to FIG. 10B and FIG. 10C. After the etching is started, at an early stage, the etching removes portions of the sapphire substrate 10 on which the resists Ra are not formed, so that shapes approximately the same with the shapes of the mask are reflected to shapes of the remaining portions of the sapphire substrate 10. As the etching progresses, the sapphire substrate 10 is subjected to effects of anisotropy in an etching rate (i.e., variance in a rate at which the etching progresses depending on directions) due to forms of crystals, and is formed into shapes reflecting the forms of crystals while the resists Ra are gradually removed (see FIG. 10B). More specifically, due to variance in the etching rate depending on etching progress directions, the etching progresses while reflecting the crystal form, and thus six vertices 13 at a bottom portion and ridge lines of the pseudo-hexagonal pyramid gradually become definite, so that protrusions corresponding to the pseudo-hexagonal-pyramid shaped projections are formed on the sapphire substrate 10 below corresponding pseudo-hexagonal resists Ra.

Figure 10A:
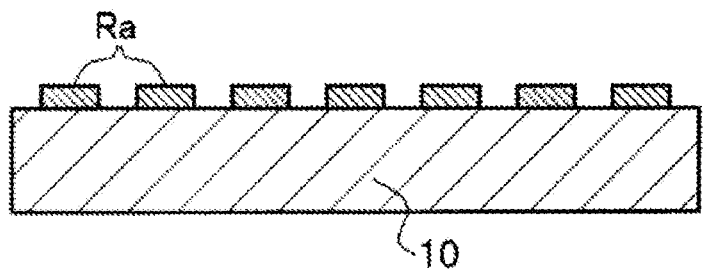
FIG. 10A is a schematic diagram illustrating a state in which the resists have been disposed on the sapphire substrate in the light-emitting element according to the first embodiment.
Figure 10B:
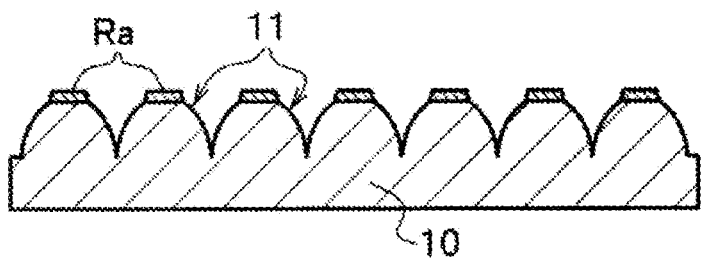
FIG. 10B is a schematic diagram illustrating a state in which the sapphire substrate in the light-emitting element according to the first embodiment is etched via the resists.
Figure 10C:
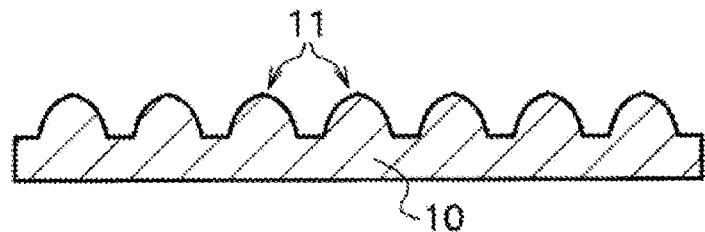
FIG. 10C is a schematic diagram illustrating a state in which the sapphire substrate in the light-emitting element according to the first embodiment and the resists on the sapphire substrate have been etched, and the projections have been formed.

Each of the protrusions to be formed into the pseudo-hexagonal pyramid has a flat top surface while the resists Ra are present on the top surface (see FIG. 10B). Also, the periphery of the each of the protrusions is etched into a pseudo-hexagonal shape, and the area of each of the protrusions become smaller than the area of each of the resists Ra. Portions of each of the protrusions corresponding to the lateral surfaces 12 and the sides 14 of each of the projections 11 are formed into inwardly curved arc shapes. The portions of each of the protrusions corresponding to the lateral surfaces 12 of each of the projections 11 are formed into approximate isosceles triangles with the sides 14 serving as the bases of the isosceles triangles. As the etching progresses, the areas of these portions are reduced, and the curvature radius of the arc of each of sides 14 is increased.

As the etching further progresses, the resist Ra disposed on the top surface of each of the protrusions are eroded, which gradually reduces the area of the resist Ra, and then, when completed, the resist Ra disappears. This allows for gradually forming a portion corresponding to the top 15 of the projection 11. The protrusion is thus formed into the pseudo-hexagonal pyramid having a sharp top 15 of the projection 11 (see FIG. 10C).

In the step S3 of dry-etching, the resist Ra has a pseudo-hexagonal top view shape made of the first curved line and the second curved line connected to each other, in which the first curved lines are formed by curving six sides of a hexagon toward the center of the hexagon, and second curved lines pass through the vertices of the hexagon. More specifically, the resists Ra is formed into the pseudo-hexagonal shape in a top view in which the portions corresponding to the vertices 13 of the shape of the projection 11 to be formed protrude toward the outer circumference in the diagonal directions of the hexagon. With this shape, the vertices 13 of each of the projections 11 forming the pseudo-hexagonal pyramid can prevent forming a shape of a bottom surface the projection 11 to be a near-circular shape like the bottom surface of a cone. In other words, the ease of erosion by etching of the resist Ra is estimated to select the shape of the resist Ra in a top view of the projections 11 to be formed. More specifically, since protruding portions of the resist Ra tend to be more easily eroded, each of the protrusions 11 has a top view in which protruding portions of the shape of the projection 11 in a top view is further protruded. The shape of the resist Ra in a top view can be selected by determining relationship between conditions of a resist and the pseudo-hexagonal pyramid to be formed through experiments or simulations.

In the step S3 of dry-etching, in a top view, each of the resists Ra preferably has a shape in which the ratio of the diameter of a circumscribed circle C3, which passes through a portion to be the outermost circumference of the pseudo-hexagon, to the diameter of an inscribed circle C4, which passes through a portion to be the innermost circumference of the pseudo-hexagon, is in a range of 1.3 to 2.0. With the ratio of the diameters of the circumscribed circle C3 and the inscribed circle C4 of 1.3 or more, the shape of the bottom surface of each of the projections 11 to be formed can be prevented from being circular. Also, with the ratio of the diameters of the circumscribed circle C3 and the inscribed circle C4 of 2.0 or smaller, great increase of the proportion of the areas of crystal growth surfaces within a surface of the sapphire substrate 10 can be prevented, so that effects of suppressing dislocations by the projections 11 can be efficiently achieved.

More specifically, vapor-phase etching, plasma etching, or reactive ion etching can be used for the dry etching. Examples of an etching gas used for the etching include Cl-based and F-based gases such as $Cl_2$, $SiCl_4$, $BCl_3$, HBr, $SF_6$, $CHF_3$, $C_4F_8$, and $CF_4$, and inert gases such as Ar. Examples of resists that can be used in the dry etching include positive resist films containing novolac resins as a main component.

With the above-described method of processing the sapphire substrate, the sapphire substrate 10 with projections 11 on which a semiconductor layer having good crystallinity can be grown can be obtained. In the step of disposing a semiconductor layered body 30 described below, using the processed sapphire substrate 10 having the projections 11 allows a semiconductor layered body 30 having a good crystallinity to be formed, so that the light-emitting element 1 having good light extraction efficiency can be obtained.

After the step S3 of dry etching, the substrate is cleaned and dried, and then the step S4 of forming the buffer layer 20 on the sapphire substrate 10 on which the projections 11 have been formed is performed. The buffer layer 20 is made of AlN, AlGaN, or other materials, and preferably formed using AlN. In the step S5 of disposing the semiconductor layered body 30 described below, growing the semiconductor layer on the buffer layer 20, which is made of single-crystal AlN and formed by sputtering, can form a semiconductor layer having good crystallinity on the c-plane of the sapphire substrate 10. Meanwhile, in this case, crystals tend to be grown on inclined surfaces of the projections 11. In the present embodiment, however, the lateral surfaces 12 of each of the projections 11 are made of crystal-growth-suppressed surfaces, the growth of crystals on the inclined surfaces can be suppressed even in the case where the buffer layer 20 is made of AlN, so that a semiconductor layer having a good crystallinity can be formed.

Next, the step S5 of disposing the semiconductor layered body 30 including the light-emitting layer by growing semiconductor layers on the sapphire substrate 10 is performed. The semiconductor layers are formed by growing nitride semiconductors.

With the sapphire substrate 10 on which the projections 11 have been formed, in the step S5 of disposing the semiconductor layered body 30, the number of dislocations in the semiconductor layered body 30 can be easily reduced, as described above. Furthermore, the lateral surfaces 12 of each of the projections 11 are made of crystal-growth-suppressed surfaces, which can reduce generation of unintended crystals, so that the semiconductor layer can be stably grown. Accordingly, the semiconductor layered body 30 having good crystallinity can be formed, so that a light-emitting element having good light extraction efficiency can be produced. With the shapes and the arrangement of the projections 11 as described above, dislocations of the crystals of the semiconductor layered body 30 can be converged in a shorter time than in conventional methods, so that the crystals can be grown to form a flat surface at a position near the sapphire substrate 10. Also, the crystal-growth-surface region of the sapphire substrate 10 located between adjacent projections 11 can have a uniform width. This arrangement allows the growth rate of the semiconductor layer to be constant, so that a semiconductor layer having a good crystallinity can be obtained.

Second Embodiment

Next, a second embodiment will be described. The second embodiment differs from the first embodiment in the shape of the mask, the shape of the resist, and the arrangement of the projections 11. The other constitutions that have been already described are the same, and their descriptions will be omitted as appropriate. The thick lines SA1 to SA3 in FIG. 11 are imaginary lines drawn to represent the directions of the a-planes.

Figure 11:
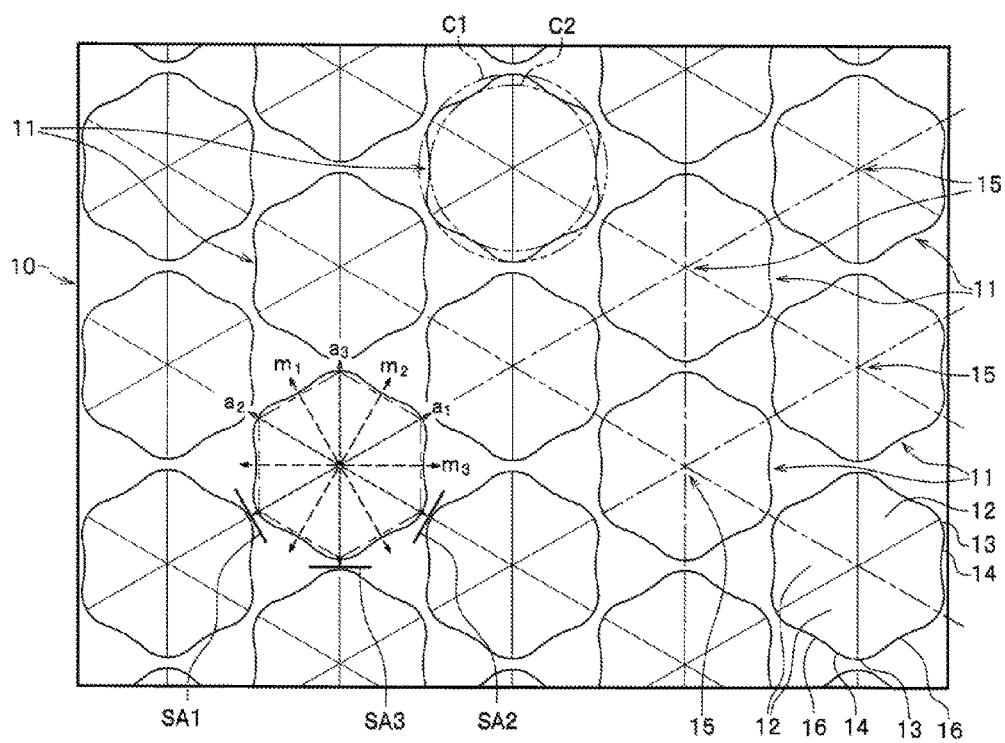
FIG. 11 is a schematic plan view of a part of an alignment of the projections projecting from the sapphire substrate in the light-emitting element according to a second embodiment.

As shown in FIG. 11, the projections 11 formed on the sapphire substrate 10 are arranged so that vertices 13 of two adjacent projections 11 will face each other. In other words, each of the vertices 13 of one projection 11 is disposed near a vertex 13 of an adjacent projection 11. Furthermore, the projections 11 are arranged so that the tops 15 that are the centers of the projections form a triangular lattice pattern in a top view. On the substrate 10, any one of the sides 14 of the projections 11 are formed to be parallel to any one of the a-axes of the sapphire substrate 10.

Also, on the substrate 10, any one of the sides of the imaginary hexagons of the projections 11 are formed to be perpendicular to any one of the a-planes of the sapphire substrate 10. With this arrangement, the r-planes and their approximate planes, on which crystals are easily grown, of the sapphire substrate are mainly located near three of the lateral surfaces 12 of the projection. In the present embodiment, the three of the lateral surfaces 12 are made of curved surfaces. Furthermore, in a top view, each of the projections has a shape including first curved lines curved toward the center of a hexagon and disposed between six vertices of the hexagon, and second curved lines passing through the vertices of the hexagon. The first curved lines and the second curved lines are coupled to each other. With this shape, the lateral surfaces 12 of each of the projections each has an inclination angle steeper than in the case where the projections each has a conical or near-conical shape, which can reduce the areas of the r-planes and their approximate planes of the sapphire substrate present in the lateral surfaces 12 of each of the projection. Accordingly, unintended crystal growth can be reduced.

Figure 12:
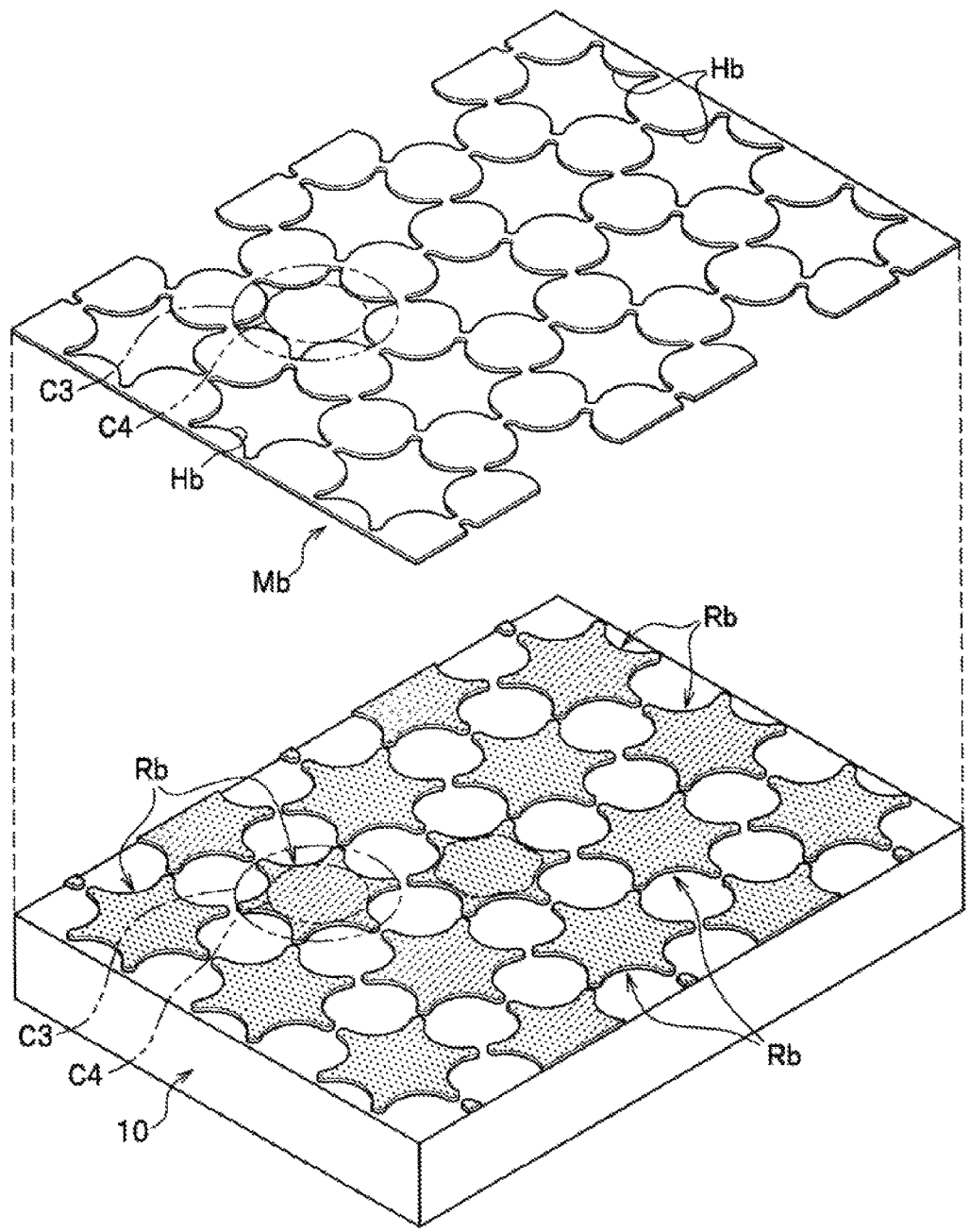
FIG. 12 is a schematic exploded perspective diagram illustrating the shapes of a mask and resists for forming the projections on the sapphire substrate of the light-emitting element according to the second embodiment.
Figure 13:
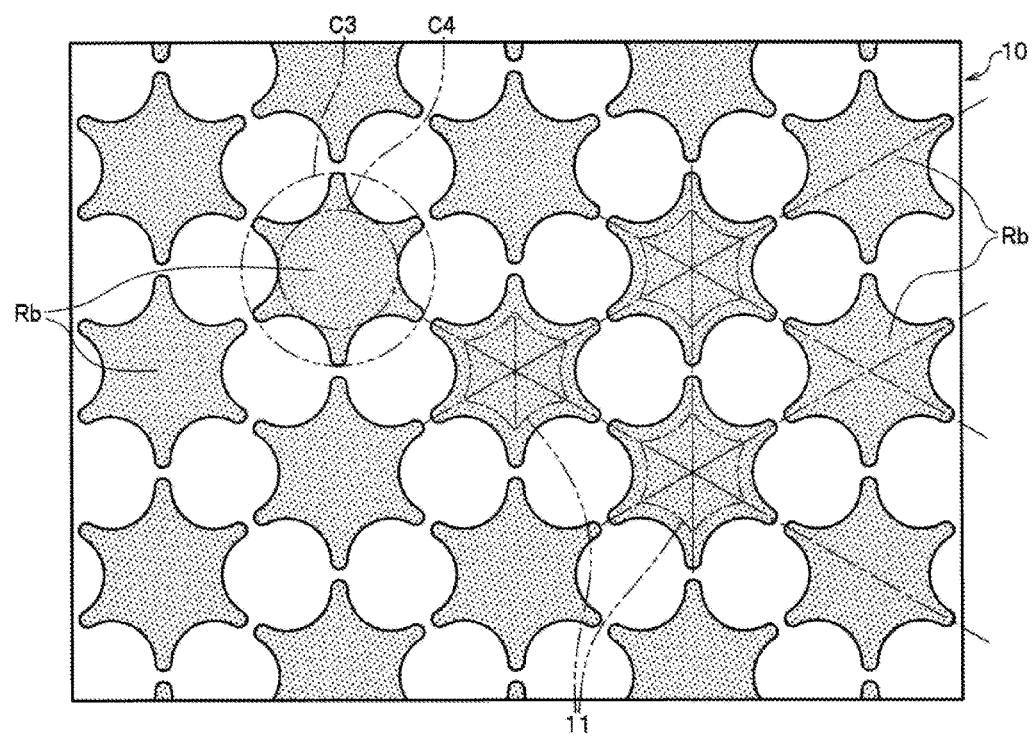
FIG. 13 is a schematic plan view of the resists for forming the projections on the sapphire substrate in the light-emitting element according to the second embodiment.

A mask Mb as shown in FIG. 12 is used in order to form the projections 11 on the sapphire substrate 10 so that vertices 13 of adjacent projections 11 are aligned so as to face each other (i.e., so as to be located at the shortest distance). Through holes Hb are formed in the mask Mb. By exposing the resist film using a stepper or other devices through the mask Mb as described above, resists Rb are formed as shown in FIG. 13. The sapphire substrate 10 is then dry-etched using the formed resists Rb as the etching mask, so that the projections 11 can be formed on the c-plane of the sapphire substrate 10. As shown in FIG. 11, the projections 11 are disposed so that the sides 14 will be aligned with respect to the a-planes of the sapphire substrate 10.

In each of the projections 11, the ratio of the diameter r1 of the circumscribed circle C1 to the diameter r2 of the inscribed circle C2 of the pseudo-hexagon is selected in the range of 1.1 to 1.8. Configurations in the present embodiment is similar to the constitution of the first embodiment described above except that the orientation of the pseudo-hexagon in the present embodiment is rotated at an angle of 30 degrees with respect to the pseudo-hexagon in FIG. 6A to FIG. 6D described above. Adjustment of the ratio to be in the predetermined range described above can be realized by adjusting the protruding lengths and widths of portions of the mask Mb corresponding to the vertices 13 of the pseudo-hexagon.

The second embodiment as described above can have effects similar to the effects of the first embodiment described above.

What is claimed is:
1. A light-emitting element comprising:
   a sapphire substrate including:
      a principal surface that is in a c-plane of the sapphire substrate, and
      a plurality of projections on the principal surface, wherein each of the plurality of projections has a shape of pseudo-hexagonal pyramid including six lateral surfaces, each of the six lateral surfaces including an inwardly curved surface portion, and wherein, in a top view of the sapphire substrate, each of the plurality of projections has a shape of a pseudo-hexagon; and
   a semiconductor layered body comprising a nitride semiconductor on the principal surface side of the sapphire substrate, the semiconductor layered body including an active layer.
2. The light-emitting element according to claim 1, wherein a ratio of a diameter of a circumscribed circle of the pseudo-hexagon to a diameter of an inscribed circle of the pseudo-hexagon is in a range of 1.1 to 1.8.

3. The light-emitting element according to claim 1,
wherein at least one side of the hexagon of each of the plurality of projections is parallel to an a-plane of the sapphire substrate in the top view.

4. The light-emitting element according to claim 2,
wherein at least one side of the hexagon of each of the plurality of projections is parallel to an a-plane of the sapphire substrate in the top view.

5. The light-emitting element according to claim 2,
wherein the plurality of projections are arranged such that, in the top view, a side of the hexagon of a first of the plurality of projections is parallel to a side of the hexagon of a second of the plurality of projections adjacent to said first projection.

6. The light-emitting element according to claim 4,
wherein the plurality of projections are arranged so that, in the top view, a side of the hexagon of a first of the plurality of projections is parallel to a side of the hexagon of a second of the plurality of projections adjacent to said first projection.

7. The light-emitting element according to claim 1,
wherein centers of the plurality of projections are arranged in a triangular lattice pattern in the top view.

8. The light-emitting element according to claim 2,
wherein centers of the plurality of projections are arranged in a triangular lattice pattern in the top view.

9. The light-emitting element according to claim 1, further comprising:
a buffer layer made of AlN, the buffer layer disposed on the principal surface of the sapphire substrate,
wherein the semiconductor layered body is disposed on the buffer layer.

10. A method of producing a light-emitting element, the method comprising:
disposing a plurality of resists on a principal surface of a sapphire substrate, the principal surface being in a c-plane of the sapphire substrate, wherein each of the plurality of resists is formed such that, in a top view of the sapphire substrate, each of the plurality of resists has a shape of a pseudo-hexagon;
forming a plurality of projections on the principal surface by dry-etching the sapphire substrate via the resists, the dry-etching removing the resists, wherein each of the plurality of projections has a shape of pseudo-hexagonal pyramid including six lateral surfaces, each of the six lateral surfaces including an inwardly curved surface portion; and
disposing a semiconductor layered body on a principal surface side of the sapphire substrate by growing semiconductor layers comprising nitride semiconductors, the semiconductor layered body including a light-emitting layer.

11. The method of producing a light-emitting element according to claim 10,
wherein, in the disposing of the plurality of resists, centers of the plurality of pseudo-hexagons are arranged in a triangular lattice pattern.

12. The method of producing a light-emitting element according to claim 10,
wherein, in the disposing of the plurality of resists, each pseudo-hexagon is disposed such that a side of the hexagon is parallel to an a-plane of the sapphire substrate.

13. The method of producing a light-emitting element according to claim 11,
wherein, in the disposing of the plurality of resists, each pseudo-hexagon is disposed such that a side of the hexagon is parallel to an a-plane of the sapphire substrate.

14. The method for producing a light-emitting element according to claim 10,
wherein, in the disposing of the plurality of resists, the resists are arranged such that a side of the hexagon of a first of the projections is parallel to a side of the hexagon of a second of the projections adjacent to said first projection.

15. The method for producing a light-emitting element according to claim 12,
wherein, in the disposing of the plurality of resists, the resists are arranged so that a side of the hexagon in one of the projections to be parallel to a side of the hexagon in another one of the projections adjacent to said first projection.

16. The method for producing a light-emitting element according to claim 10, further comprising:
between the forming of the projections and the disposing of the semiconductor layered body, disposing a buffer layer on the principal surface of the sapphire substrate, the buffer layer being made of AlN,
wherein the semiconductor layers are grown on the buffer layer.

17. The method for producing a light-emitting element according to claim 11, further comprising:
between the forming of the projections and the disposing of the semiconductor layered body, disposing a buffer layer on the principal surface of the sapphire substrate, the buffer layer being made of AlN,
wherein the semiconductor layers are grown on the buffer layer.

18. The method for producing a light-emitting element according to claim 10,
wherein, in the disposing of the plurality of resists, each of the plurality of resists is disposed such that a ratio of a diameter of a circumscribed circle of the pseudo-hexagon to a diameter of an inscribed circle of the pseudo-hexagon in a range of 1.3 to 2.0.

19. The method for producing a light-emitting element according to claim 11,
wherein, in the disposing of the plurality of resists, each of the plurality of resists is disposed such that a ratio of a diameter of a circumscribed circle of the pseudo-hexagon to a diameter of an inscribed circle of the pseudo-hexagon in a range of 1.3 to 2.0.

* * * * *